United States Patent
Gao et al.

(10) Patent No.: US 10,115,765 B2
(45) Date of Patent: Oct. 30, 2018

(54) X-RAY FLAT-PANEL DETECTOR AND METHOD FOR PREPARING THE SAME, AND WHITE INSULATING MATERIAL

(71) Applicant: BOE TECHNOLOGY GROUP CO., LTD., Beijing (CN)

(72) Inventors: Jincheng Gao, Beijing (CN); Zhanfeng Cao, Beijing (CN); Qi Yao, Beijing (CN); Zhengliang Li, Beijing (CN); Xiaolong He, Beijing (CN); Bin Zhang, Beijing (CN); Xiangchun Kong, Beijing (CN); Wei Zhang, Beijing (CN)

(73) Assignee: BOE TECHNOLOGY GROUP CO., LTD., Biejing (CN)

( * ) Notice: Subject to any disclaimer, the term of this patent is extended or adjusted under 35 U.S.C. 154(b) by 0 days.

(21) Appl. No.: 14/909,712

(22) PCT Filed: Aug. 10, 2015

(86) PCT No.: PCT/CN2015/086441
§ 371 (c)(1),
(2) Date: Feb. 2, 2016

(87) PCT Pub. No.: WO2016/155181
PCT Pub. Date: Oct. 6, 2016

(65) Prior Publication Data
US 2016/0293658 A1    Oct. 6, 2016

(30) Foreign Application Priority Data

Apr. 1, 2015    (CN) .......................... 2015 1 0152077

(51) Int. Cl.
*H01L 27/146*    (2006.01)
*G01T 1/24*    (2006.01)

(52) U.S. Cl.
CPC ........ *H01L 27/14658* (2013.01); *G01T 1/241* (2013.01); *G01T 1/244* (2013.01);
(Continued)

(58) Field of Classification Search
CPC ........... H01L 27/1225; H01L 27/14658; H01L 27/124
See application file for complete search history.

(56) References Cited

U.S. PATENT DOCUMENTS

2010/0320391 A1*  12/2010  Antonuk ............. H01L 27/1462
                                                          250/366
2012/0009387 A1*   1/2012  Wang ........................ C08J 5/18
                                                          428/141
(Continued)

FOREIGN PATENT DOCUMENTS

CN       101159283         4/2008
CN       101159283 A       4/2008
(Continued)

OTHER PUBLICATIONS

Seo et al., Reliable Bottom Gate Amorphous Indium—Gallium—Zinc Oxide Thin-Film Transistors with TiOx Passivation Layer, Jul. 9, 2009 Electrochemical and Solid-State Letters, 12 (9), pp. H348-H351.*

(Continued)

*Primary Examiner* — Marcos D Pizarro
*Assistant Examiner* — Shannon Yi
(74) *Attorney, Agent, or Firm* — Brooks Kushman P.C.

(57) ABSTRACT

The present disclosure discloses an X-ray flat-panel detector and a method for preparing the same, and a white insulating material. The X-ray flat-panel detector includes: a thin-film transistor substrate; an insulating reflection layer, which is provided on the thin-film transistor substrate and has a reflection function, wherein the insulating reflection layer is (Continued)

provided with a contact hole through which a source electrode of the thin-film transistor substrate is exposed; a pixel electrode, which is provided on the insulating reflection layer, wherein the pixel electrode is electrically connected to the source electrode of the thin-film transistor substrate via the contact hole; a photodiode, which covers the pixel electrode; an electrode, which is provided on the photodiode; and an X-ray conversion layer, which is provided on the electrode.

15 Claims, 2 Drawing Sheets

(52) U.S. Cl.
CPC .... *H01L 27/1462* (2013.01); *H01L 27/14612* (2013.01); *H01L 27/14614* (2013.01); *H01L 27/14625* (2013.01); *H01L 27/14636* (2013.01); *H01L 27/14685* (2013.01); *H01L 27/14689* (2013.01); *H01L 27/14692* (2013.01)

(56) References Cited

U.S. PATENT DOCUMENTS

| | | | |
|---|---|---|---|
| 2013/0059955 A1* | 3/2013 | Tai | C08K 5/521 524/114 |
| 2014/0138549 A1 | 5/2014 | Huh et al. | |
| 2014/0361182 A1 | 12/2014 | Hasegawa et al. | |
| 2015/0103977 A1* | 4/2015 | Ono | H01L 27/14632 378/62 |
| 2015/0270299 A1 | 9/2015 | Gao et al. | |
| 2016/0190202 A1* | 6/2016 | Fujiwara | H01L 27/14632 257/43 |
| 2016/0293658 A1 | 10/2016 | Gao et al. | |

FOREIGN PATENT DOCUMENTS

| | | | |
|---|---|---|---|
| CN | 103474474 A | | 12/2013 |
| CN | 104072911 | * | 10/2014 |
| CN | 104240786 A | | 12/2014 |
| CN | 104716152 A | | 6/2015 |
| CN | 204558467 U | | 8/2015 |
| GB | 1270611 A | * | 4/1972 ................ C09J 5/06 |

OTHER PUBLICATIONS

Second Office Action for Chinese Application No. 201510152077.5, dated Oct. 10, 2017, 8 Pages.
Third Office Action for Chinese Application No. 201510152077.5, dated Apr. 10, 2018, 10 Pages.
First Office Action for Chinese Application No. 201510152077.5, dated Mar. 3, 2017, 9 Pages.
International Search Report and Written Opinion for Application No. PCT/CN2015/086441, dated Dec. 24, 2015, 13 Pages.

* cited by examiner

X-RAY FLAT-PANEL DETECTOR AND METHOD FOR PREPARING THE SAME, AND WHITE INSULATING MATERIAL

CROSS-REFERENCE TO RELATED APPLICATION

The present application is the U.S. national phase of PCT Application No. PCT/CN2015/086441 filed on Aug. 10, 2015, which claims priority of the Chinese patent application No. 201510152077.5 filed in China on Apr. 1, 2015, the entire content of which is incorporated reference.

TECHNICAL FIELD

The present disclosure relates to an X-ray flat-panel detector and a method for preparing the same, and a white insulating material.

BACKGROUND

In recent years, flat-panel detection technologies develop drastically. Patent Document 1 describes a flat-panel detection technology which realizes the reduction of the cost of flat-panel detector, thereby the application of flat-panel detectors is popularized more rapidly and widely.

Flat-panel detection technologies may be divided into the following two types: direct detection and indirect detection. The key part of an indirect flat-panel detector is a flat-panel detector (FPD) for acquiring an image, which consists of the parts such as an X-ray conversion layer, a photodiode, a thin-film transistor, a signal storage basic pixel unit and a signal amplifying and reading unit, etc. The operating principle is as follows: an X-ray is converted into a visible light of about 550 nm via an X-ray conversion layer, the visible light is converted into an electrical signal via a photodiode, the electrical signal is stored in a signal storage unit by a thin-film transistor, and under the action of a driver circuit, the charges stored in a pixel unit is transferred to a read-out circuit, and the read-out circuit will further process the electrical signal, for example, amplify and perform analog-digital conversion on the electrical signal, and finally obtain the image information.

The amorphous silicon thin film in a photodiode has a photo-degeneration effect, which causes the photoelectric conversion efficiency of the photodiode to decrease after long-time illumination. Decreasing the thickness of the amorphous silicon thin film is helpful to reduce the photo-degeneration problem; however, when the thickness of the amorphous silicon thin film is decreased, the incident light will not be fully absorbed, and a large amount of light will penetrate the photodiode element, thus the conversion efficiency of the photodiode will be lowered. Therefore, it has become an important problem to be solved in the designing and manufacturing field of X-ray flat-panel detectors to control the thickness of the amorphous silicon thin film in a photodiode, reduce the photo-degeneration effect, and at the same time, increase the absorption efficiency and the photoelectric conversion efficiency of the photodiode on the incident light and thus increase the quantum detection efficiency of a ray detector.

PRIOR ART DOCUMENT

Patent Document: CN Patent Publication No. CN101159283A

SUMMARY

To solve the above technical problem, the disclosure provides an X-ray flat-panel detector. The X-ray flat-panel detector can reflect the light beams that penetrate a photoelectric conversion diode back to the photoelectric conversion diode and effectively improve the utilization efficiency of the incident light, thereby the quantum detection efficiency and sensitivity of the detector can be improved.

An X-ray flat-panel detector according to the disclosure includes:

a thin-film transistor substrate;

an insulating reflection layer, which is provided on the thin-film transistor substrate and has a reflection function, wherein the insulating reflection layer is provided with a contact hole through which a source electrode of the thin-film transistor substrate is exposed;

a pixel electrode, which is provided on the insulating reflection layer, wherein the pixel electrode is electrically connected to the source electrode of the thin-film transistor substrate by covering the side wall and the bottom face of the contact hole;

a photodiode, which covers the pixel electrode;

an electrode, which is provided on the photodiode; and an X-ray conversion layer, which is provided on the electrode.

According to one embodiment of the disclosure, the thin-film transistor substrate includes:

a substrate;

a gate electrode, which is formed on the substrate;

a gate insulating layer, which is formed on the gate electrode;

an active layer, which is formed above the gate insulating layer; and a source electrode and a drain electrode, which are formed on the active layer.

According to one embodiment of the disclosure, the insulating reflection layer is made of a white insulating material, which contains 80%-98% of a resin matrix and 2%-20% of a light-beam diffuse reflection functional material powder.

According to one embodiment of the disclosure, the light-beam diffuse reflection functional material is a white inorganic material, for example, titanium dioxide, zinc oxide, barium sulfate and calcium carbonate, etc., and preferably, titanium dioxide, and more preferably, anatase-type titanium dioxide.

According to one embodiment of the disclosure, the resin matrix is at least one of selected from: ethylene-vinyl acetate copolymer, ethylene-vinyl acetate formaldehyde crosslinked polymer, thermoplastic polyurethane elastomer, or an ionic or complex modified material of the above three materials.

According to one embodiment of the disclosure, the white insulating material may further contain 0.5%-8% of an auxiliary.

According to one embodiment of the disclosure, the auxiliary is a plasticizer.

The disclosure further provides a white insulating material, which contains 80%-98% of a resin matrix and 2%-20% of a light-beam diffuse reflection functional material powder.

According to one embodiment of the disclosure, the light-beam diffuse reflection functional material is a white inorganic material, for example, titanium dioxide, zinc oxide, barium sulfate, calcium carbonate, etc., and preferably, titanium dioxide, and more preferably, anatase-type titanium dioxide.

According to one embodiment of the disclosure, the resin matrix is at least one of selected from: ethylene-vinyl acetate copolymer, ethylene-vinyl acetate formaldehyde crosslinked polymer, thermoplastic polyurethane elastomer, or an ionic or complex modified material of the above three materials.

According to one embodiment of the disclosure, the white insulating material may further contain 0.5%-8% of an auxiliary.

According to one embodiment of the disclosure, the auxiliary is a plasticizer.

The disclosure further provides a method for preparing the X-ray flat-panel detector, which includes the steps of:

providing a thin-film transistor substrate;

forming an insulating reflection layer with a reflection function on the thin-film transistor substrate, wherein the insulating reflection layer is provided with a contact hole through which a source electrode of the thin-film transistor substrate is exposed;

forming a pixel electrode on the insulating reflection layer, wherein the pixel electrode is electrically connected to the source electrode of the thin-film transistor substrate by forming on the side wall and the bottom face of the contact hole;

forming a photodiode on the pixel electrode;

forming an electrode on the photodiode; and forming an X-ray conversion layer on the electrode.

According to one embodiment of the disclosure, the thin-film transistor substrate is prepared by the following steps:

providing a substrate;

forming, on the substrate, a gate electrode and a gate line connected with the gate electrode;

forming a gate insulating layer on the gate electrode and the gate line;

forming an active layer on the gate insulating layer; and forming a source electrode, a drain electrode and a data scanning line on the active layer.

According to one embodiment of the disclosure, the insulating reflection layer is made of a white insulating material, which comprises 80%-98% of a resin matrix and 2%-20% of a light-beam diffuse reflection functional material powder.

According to one embodiment of the disclosure, the light-beam diffuse reflection functional material is a white inorganic material, for example, titanium dioxide, zinc oxide, barium sulfate and calcium carbonate, etc., and preferably, titanium dioxide, and more preferably, anatase-type titanium dioxide.

According to one embodiment of the disclosure, the resin matrix is at least one of selected from: ethylene-vinyl acetate copolymer, ethylene-vinyl acetate formaldehyde crosslinked polymer, thermoplastic polyurethane elastomer, or an ionic or complex modified material of the above three materials.

According to one embodiment of the disclosure, the white insulating material may further contain 0.5%-8% of an auxiliary.

According to one embodiment of the disclosure, the auxiliary is a plasticizer.

The X-ray flat-panel detector according to the disclosure has high quantum detection efficiency and sensitivity.

DETAILED DESCRIPTION OF EMBODIMENTS

The X-ray flat-panel detector according to the disclosure can reflect the light beams that penetrate a photoelectric conversion diode back to the photoelectric conversion diode, thereby effectively increasing the utilization efficiency of the incident light and increasing the quantum detection efficiency and sensitivity of the detector.

Figure 1:
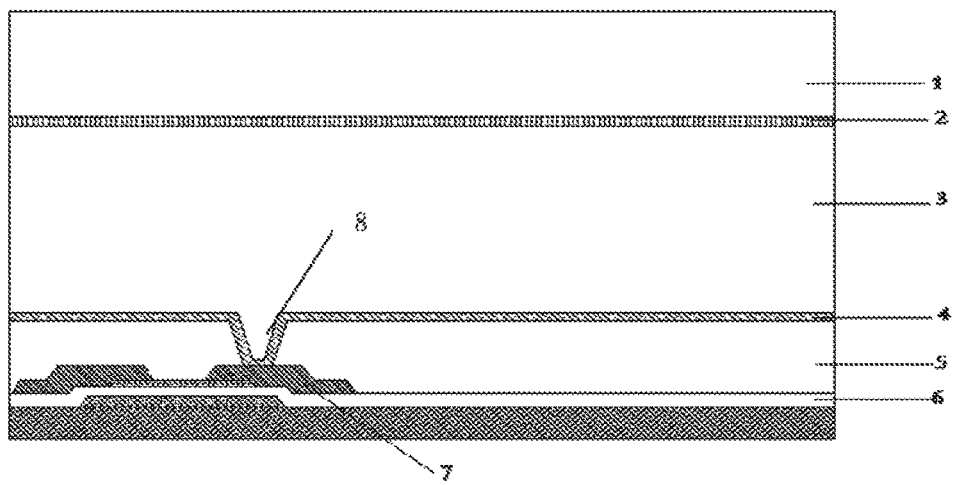
FIG. 1 shows a structural representation of an X-ray flat-panel detector according to the disclosure.
Figure 2:
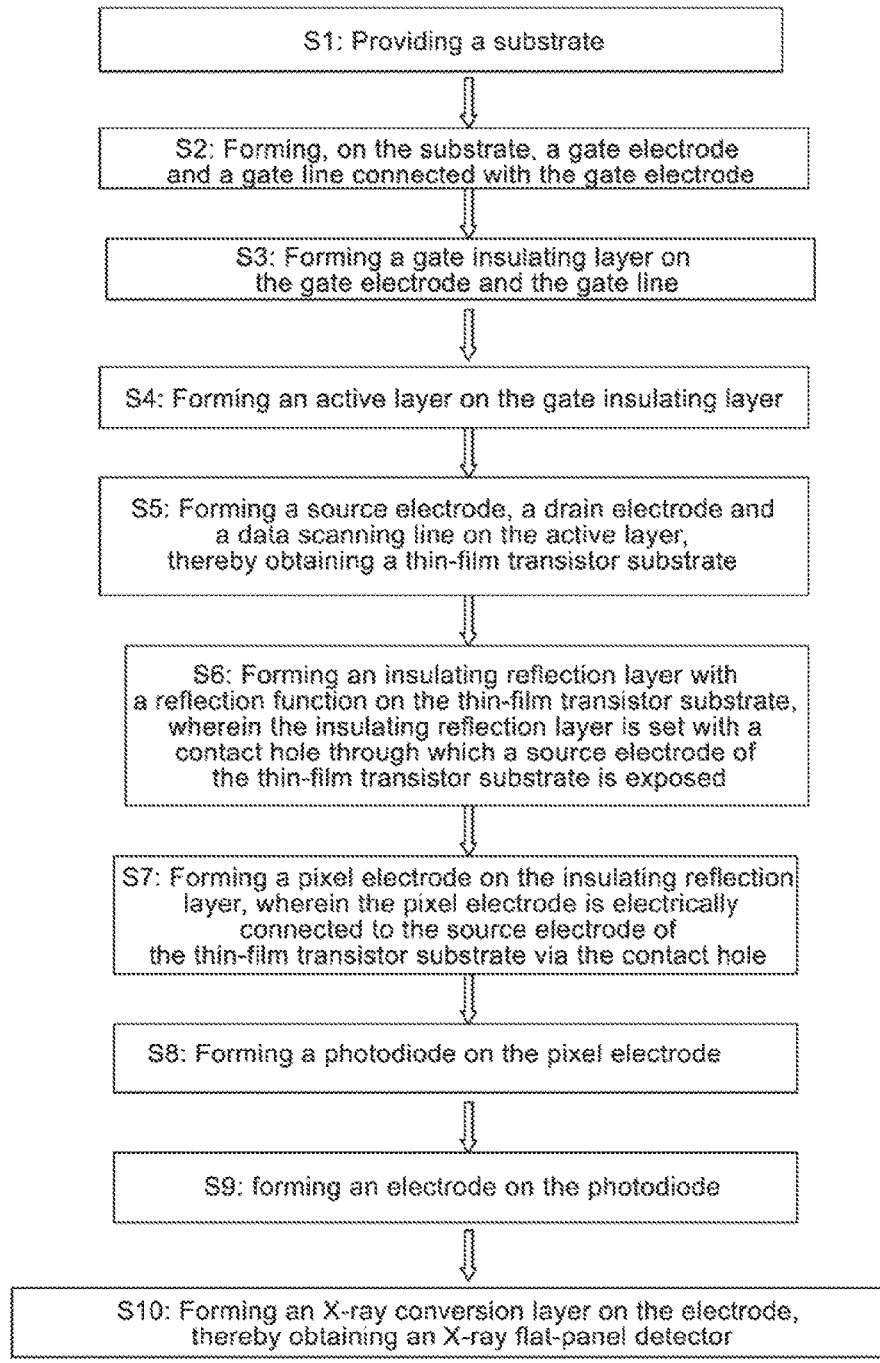
FIG. 2 shows a flow chart of a method for preparing the X-ray flat-panel detector according to the disclosure.

According to one embodiment of the disclosure, there provides an X-ray flat-panel detector, as shown in FIG. 1, which includes:

a thin-film transistor substrate 6;

an insulating reflection layer 5, which is provided on the thin-film transistor substrate 6 and has a reflection function, wherein the insulating reflection layer 5 is provided with a contact hole 8 that exposes a source electrode 7 of the thin-film transistor substrate 6;

a pixel electrode 4, which is provided on the insulating reflection layer 5, wherein the pixel electrode 4 is electrically connected to the source electrode 7 of the thin-film transistor substrate 6 by covering the side wall and the bottom face of the contact hole 8;

a photodiode 3, which covers the pixel electrode;

an electrode 2, which is provided on the photodiode 3; and an X-ray conversion layer 1, which is provided on the electrode 2.

According to one embodiment of the disclosure, the insulating reflection layer 5 is made of a white insulating material. For example, it may be made by forming a film of the white insulating material and then curing the film. The white insulating material contains 80%-98% of a resin matrix and 2%-20% of a light-beam diffuse reflection functional material powder, and it may further contain 0.5%-8% of an auxiliary.

In this application, unless otherwise illustrated, the "%" refers to a weight percentage of each component relative the white insulating material.

The white insulating material is adapted to form an insulating reflection layer of the X-ray flat-panel detector according to the disclosure. The insulating reflection layer may reflect the light beams that penetrate a photoelectric conversion diode back to the photoelectric conversion diode, thereby effectively increasing the utilization efficiency of the incident light and increasing the quantum detection efficiency and sensitivity of the detector.

According to one embodiment of the disclosure, the light-beam diffuse reflection functional material is a material with a reflection function, for example, a white inorganic material such as titanium dioxide, zinc oxide, barium sulfate and calcium carbonate, etc., and preferably, titanium dioxide, most preferably, anatase-type titanium dioxide.

Preferably, the light-beam diffuse reflection functional material is in the form of powder. The average grain diameter of the powder may be 1-1000 μm, and preferably, 200-500 μm, more preferably, 250-300 μm.

When titanium dioxide powder is used, a modified titanium dioxide is preferably obtained by modifying the titanium dioxide with at least one of a rare-earth metal mineral and an organic rare-earth metal complex. It is difficult for the modified titanium dioxide grains to agglomerate, and they tend to be infiltrated in an organic phase, thereby the compatibility and binding force thereof with an organic molecule can be increased, and the dispersion stability can be improved.

According to one embodiment of the disclosure, the resin matrix is a resin material with a light transmission function; for example, the resin matrix is at least one of selected from: ethylene-vinyl acetate copolymer, ethylene-vinyl acetate formaldehyde crosslinked polymer and thermoplastic polyurethane elastomer, and more preferably, an ionic or complex modified material of the above three materials.

Under a moist and heat condition, the bond strength of the resin matrix will be greatly decreased, and the creep resistance of a film formed will be poor, and the substratum will slide even under the action of a long-duration static load. At the same time, its moisture resistance, cold hardiness and mechanical stability will be poor. By modifying the materials that form the resin matrix, the above features of the resin material may be improved.

According to one embodiment of the disclosure, the white insulating material may further contain 0.5%-8% of an auxiliary. Under the premise that the features of the white insulating material of the disclosure are not influenced, auxiliaries (for example, plasticizer, lubricant, antioxidant, anti-UV agent and stabilizer, etc.) well-known in the art may be selected to improve one or more features of the white insulating material. A plasticizer is preferred, and plasticizers well-known in the art may be selected.

By proportionally mixing the resin matrix, powder of the light-beam diffuse reflection functional material and an auxiliary as required uniformity, a white insulating material is formed, and then an insulating reflection layer is formed via film-forming and curing. For the method for film-forming and curing, it may be selected properly according to the resin matrix, without particular limitation.

According to one embodiment of the disclosure, the thin-film transistor substrate includes:

a substrate;

a gate electrode, which is formed on the substrate;

a gate insulating layer, which is formed on the gate electrode;

an active layer, which is formed above the gate insulating layer; and a source electrode and a drain electrode, which are formed on the active layer.

The thin-film transistor substrate is not limited to the above structure, and both the top gate-type and bottom gate-type thin film transistors of the prior art may be applied to the disclosure, without further limitation.

According to one embodiment of the disclosure, there provides a method for manufacturing an X-ray flat-panel detector of the disclosure, which includes the steps of:

S1: providing a substrate;

Wherein, the substrate may be a glass substrate and a quartz substrate, etc.

S2: forming, on the substrate, a gate electrode and agate line connected with the gate electrode;

A gate line film layer is deposited on the substrate, and a gate electrode and a gate line that is connected with the gate electrode are formed via a patterning process.

Specifically, first of all, a gate line film layer may be deposited on the substrate via sputtering or heat evaporation. The gate line film layer may employ a metal such as Cr, W, Ti, Ta, Mo, Al or Cu, etc. or an alloy thereof. Then the gate line film layer may be etched via a mask plate in a patterning process. Finally agate electrode and a gate line that is connected with the gate electrode may be formed on the substrate.

Generally, the patterning process includes processes such as substrate cleaning, film-forming, photoresist coating, exposing, developing, etching and photoresist peeling, etc.

For a metal layer, physical vapor deposition (for example, magnetron sputtering) is generally employed for film-forming, and patterns are formed via wet etching. However, for a non-metal layer, chemical vapor deposition is generally employed for film-forming, and patterns are formed via dry etching.

S3: forming a gate insulating layer on the gate electrode and the gate line;

Agate insulating film layer is deposited on the substrate formed with the gate electrode and the gate line, thereby a gate insulating layer is formed;

Specifically, a gate insulating film layer may be deposited on the substrate formed with the gate electrode and the gate line via plasma-enhanced chemical vapor deposition (PECVD), thereby a gate insulating layer 3 is formed. The gate insulating film layer may employ an oxide, a nitride or an oxynitride, and the corresponding reacting gas may be a gas mixture of $SiH_4$, $NH_4$ and $N_2$ or a gas mixture of $SiH_2Cl_2$, $NH_3$ and $N_2$.

S4: forming an active layer on the gate insulating layer;

A source-drain metal film is deposited on the substrate formed with the gate insulating layer.

S5: forming a source electrode, a drain electrode and a data scanning line on the active layer, thereby obtaining a thin-film transistor substrate;

A source electrode, a drain electrode and a data scanning line (not shown) are formed via a patterning process.

S6: forming an insulating reflection layer with a reflection function on the thin-film transistor substrate, wherein the insulating reflection layer is provided with a contact hole through which a source electrode of the thin-film transistor substrate is exposed;

The insulating reflection layer is a film consisting of a white insulating material. For example, the white insulating material includes, by weight percentage, 85% of a ethylene-vinyl acetate copolymer, 14% of an anatase-type titanium dioxide powder with an average grain diameter of 250 μm, and 1% of a plasticizer. By mixing, film-forming and curing 85% of a ethylene-vinyl acetate copolymer, 14% of an anatase-type titanium dioxide powder and 1% of a plasticizer, a white insulating material film, i.e., an insulating reflection layer, may be obtained. The reflectivity of the insulating reflection layer is 93.2% as tested under a light beam wavelength of 550 nm.

S7: forming a pixel electrode on the insulating reflection layer, wherein the pixel electrode is electrically connected to the source electrode of the thin-film transistor substrate by covering the side wall and the bottom face of the contact hole;

S8: forming a photodiode on the pixel electrode;

S9: forming an electrode on the photodiode; and

S10: forming an X-ray conversion layer on the electrode, thereby obtaining an X-ray flat-panel detector.

In comparison with an X-ray flat-panel detector that does not employ a white insulating material film, the quantum detection efficiency of this X-ray flat-panel detector is increased from 40% to 45%.

The above description only shows some alternative embodiments of the disclosure. It should be noted that, for one of ordinary skills in the art, various improvements and substitutions may further be made without departing from the technical principles of the disclosure, and all these improvements and substitutions should be regarded as falling into the protection scope of the disclosure.

What is claimed is:

1. An X-ray flat-panel detector, comprising:
a thin-film transistor substrate;
an insulating reflection layer, which is provided on the thin-film transistor substrate and has a diffuse reflection function, wherein the insulating reflection layer is provided with a contact hole through which a source electrode of the thin-film transistor substrate is exposed, the insulating reflection layer being made of a white insulating material containing, by weight percentage, 80%-98% of a resin matrix and 2%-20% of a light-beam diffuse reflection functional material powder;
a pixel electrode, which is provided on the insulating reflection layer, wherein the pixel electrode is electrically connected to the source electrode of the thin-film transistor substrate via the contact hole;
a photodiode, which covers the pixel electrode;
an electrode, which is provided on the photodiode; and
an X-ray conversion layer, which is provided on the electrode.

2. The X-ray flat-panel detector according to claim 1, wherein, the thin-film transistor substrate comprises:
a substrate;
a gate electrode, which is formed on the substrate;
a gate insulating layer, which is formed on the gate electrode;
an active layer, which is formed above the gate insulating layer; and
a source electrode and a drain electrode, which are formed on the active layer.

3. The X-ray flat-panel detector according to claim 1, wherein, the light-beam diffuse reflection functional material is at least one of titanium dioxide, zinc oxide, barium sulfate or calcium carbonate.

4. The X-ray flat-panel detector according to claim 1, wherein, the resin matrix is at least one selected from: ethylene-vinyl acetate copolymer, ethylene-vinyl acetate formaldehyde crosslinked polymer, or an ionic or complex modified material of the above materials.

5. The X-ray flat-panel detector according to claim 1, wherein, the white insulating material further contains 0.5%-8% of an auxiliary.

6. The X-ray flat-panel detector according to claim 1, wherein the average grain diameter of the light-beam diffuse reflection functional material powder is from 200 µm to 500 µm.

7. The X-ray flat-panel detector according to claim 3, wherein, the light-beam diffuse reflection functional material is anatase-type titanium dioxide.

8. A white insulating material, which consists of, by weight percentage, 80%-98% of a resin matrix, and 2%-20% of a light-beam diffuse reflection functional material powder and 0.5%-8% of a plasticizer, wherein the light beam diffuse reflection functional material is anatase-type titanium dioxide, and the average grain diameter of the light-beam diffuse reflection functional material powder is from 200 µm to 500 µm.

9. The white insulating material according to claim 8, wherein, the resin matrix is at least one selected from: ethylene-vinyl acetate copolymer, ethylene-vinyl acetate formaldehyde crosslinked polymer, or an ionic or complex modified material of the above materials.

10. A method for preparing an X-ray flat-panel detector, comprising:
providing a thin-film transistor substrate;
forming an insulating reflection layer with a reflection function on the thin-film transistor substrate, wherein the insulating reflection layer is provided with a contact hole through which a source electrode of the thin-film transistor substrate is exposed, the insulating reflection layer being made of a white insulating material containing, by weight percentage, 80%-98% of a resin matrix and 2%-20% of a light-beam diffuse reflection functional material powder;
forming a pixel electrode on the insulating reflection layer, wherein the pixel electrode is electrically connected to the source electrode of the thin-film transistor substrate via the contact hole;
forming a photodiode on the pixel electrode;
forming an electrode on the photodiode; and
forming an X-ray conversion layer on the electrode.

11. The preparation method according to claim 10, wherein, the thin-film transistor substrate is prepared according to the steps of:
providing a substrate;
forming a gate electrode on the substrate;
forming a gate insulating layer on the gate electrode;
forming an active layer on the gate insulating layer; and
forming a source electrode and a drain electrode on the active layer.

12. The preparation method according to claim 10, wherein, the light-beam diffuse reflection functional material is at least one of titanium dioxide, zinc oxide, barium sulfate or calcium carbonate.

13. The preparation method according to claim 10, wherein, the resin matrix is at least one selected from: ethylene-vinyl acetate copolymer, ethylene-vinyl acetate formaldehyde crosslinked polymer, or an ionic or complex modified material of the above materials.

14. The preparation method according to claim 10, wherein, the white insulating material further contains 0.5%-8% of an auxiliary.

15. The preparation method according to claim 12, wherein, the light-beam diffuse reflection functional material is anatase-type titanium dioxide.

* * * * *